(12) United States Patent
Breitwisch et al.

(10) Patent No.: US 7,943,420 B1
(45) Date of Patent: May 17, 2011

(54) SINGLE MASK ADDER PHASE CHANGE MEMORY ELEMENT

(75) Inventors: Matthew J. Breitwisch, Yorktown Heights, NY (US); Chung Hon Lam, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/625,855

(22) Filed: Nov. 25, 2009

(51) Int. Cl.
  *H01L 21/06* (2006.01)
(52) U.S. Cl. .............................. 438/102; 257/E21.067
(58) Field of Classification Search .................. 438/95, 438/102, 104; 257/E21.067, E21.078
See application file for complete search history.

(56) References Cited

U.S. PATENT DOCUMENTS

| | | | |
|---|---|---|---|
| 7,423,300 | B2 | 9/2008 | Lung et al. |
| 7,476,587 | B2 | 1/2009 | Lung |
| 7,485,487 | B1 | 2/2009 | Breitwisch et al. |
| 7,560,721 | B1 * | 7/2009 | Breitwisch et al. ................ 257/2 |
| 2006/0175599 | A1 | 8/2006 | Happ |
| 2008/0061341 | A1 | 3/2008 | Lung |
| 2008/0203379 | A1 | 8/2008 | Magistretti et al. |
| 2008/0246014 | A1 | 10/2008 | Lung |
| 2008/0265239 | A1 | 10/2008 | Philipp et al. |
| 2009/0185411 | A1 | 7/2009 | Happ et al. |
| 2009/0242865 | A1 | 10/2009 | Lung et al. |

FOREIGN PATENT DOCUMENTS

EP 1830362 A2 9/2007

OTHER PUBLICATIONS

M. Breitwisch, et al.; Novel Lithography-Independent Pore Phase Change Memory; 2007 IEEE Symposium on VLSI Technology, vol. 12-14, Jun. 2007 pp. 100-101.
International Search Report International Application No: PCT/EP2010/066131; International Filing Date: Oct. 26, 2010; Date of Mailing: Jan. 19, 2011.
International Search Report—Written Opinion; International Application No: PCT/EP2010/066131; International Filing Date: Oct. 26, 2010; Date of Mailing: Jan. 19, 2011.

* cited by examiner

*Primary Examiner* — Quoc D Hoang
(74) *Attorney, Agent, or Firm* — Cantor Colburn LLP; Vazken Alexanian

(57) ABSTRACT

A method of fabricating a phase change memory element within a semiconductor structure and a semiconductor structure having the same that includes etching an opening to an upper surface of a bottom electrode, the opening being formed of a height equal to a height of a metal region formed within a dielectric layer at a same layer within the semiconductor structure, depositing a conformal film within the opening and recessing the conformal film to expose the upper surface of the bottom electrode, depositing phase change material within the opening, recessing the phase change material within the opening, and forming a top electrode on the recessed phase change material.

17 Claims, 21 Drawing Sheets

US 7,943,420 B1

SINGLE MASK ADDER PHASE CHANGE MEMORY ELEMENT

BACKGROUND

The present invention relates generally to semiconductor structures, and more specifically, to a semiconductor structure having an embedded single mask adder phase change memory element and a method for fabricating the same using a keyhole-transfer method.

Typically, programming currents required by phase change memories require some aspect of the structure to have a feature size which is sub-lithographically defined in order to maintain a small cell size for the phase change memory element and access circuitry. Some applications, such as fuse devices, have less stringent area requirements. In these applications, it is important to minimize the additional processing costs required to fabricate an embedded memory element into an existing complementary metal oxide semiconductor (CMOS) technology, for example.

FIG. 1 illustrates a typical semiconductor structure. As shown in FIG. 1, a CMOS structure 10 includes a substrate 11 having a borophosphosilicate glass (BPSG) dielectric layer 12 formed thereon. A plurality of conductive contacts 14 (e.g., tungsten) are formed in the BPSG dielectric layer 12 and surrounded by a liner 15 of titanium nitride, for example, used prior to the deposition of the tungsten fill, to form the conductive contacts 14. An access transistor having a gate 16 and spacers 17 adjacent to the sidewalls of the gate 16, and source/drain regions 18 is also provided. Shallow trench isolation (STI) regions 19 are formed within the substrate 11 to provide electrical isolation between the access transistor and other devices. The conductive contacts 14 connect to the source/drain regions 18. A first metal region 21 (M1) is formed on top of each conductive contact 14 within a first dielectric layer 20 and capped with a first cap layer 22. A second dielectric layer 23 is then formed to contain vias 24 and capped with a second cap layer 25. A second metal region 26 (M2) is formed within a third dielectric layer 28, over each via 24 with the vias 24 connecting the first metal regions 21 to the second metal regions 26.

SUMMARY

The present invention provides a manner in which to minimize the above-mentioned processing costs by minimizing the number of additional lithographic masking levels used within the semiconductor structure. Therefore, the present invention provides a method for fabricating an embedded phase change memory element into a semiconductor structure with the addition of only a single lithography masking operation utilizing the scaled dimensions of the semiconductor structure and a keyhole-transfer method.

According to one embodiment of the present invention, a method of fabricating a phase change memory element within a semiconductor structure is provided. The method includes etching an opening to an upper surface of a bottom electrode, the opening being formed of a height equal to a height of a metal region formed within a dielectric layer at a same layer within the semiconductor structure, and depositing a conformal film within the opening and recessing the conformal film to expose the upper surface of the bottom electrode. The method further includes depositing phase change material within the opening, recessing the phase change material within the opening, and forming a top electrode on the recessed phase change material.

According to another embodiment of the present invention, a method for fabricating a semiconductor structure having a single mask adder phase change memory element embedded therein is provided. The method includes recessing a plurality of conductive contacts to form a plurality of vias at an upper surface of each conductive contact within a substrate including access circuitry to be connected with the conductive contacts and first dielectric layer formed thereon, forming a bottom electrode in each via formed, forming a first metal region within a second dielectric layer formed on a respective bottom electrode, etching an opening within the second dielectric layer to an upper surface of a respective bottom electrode adjacent to the first metal region, depositing a conformal film within the opening and recessing the conformal film to expose the upper surface of the respective bottom electrode. The method further includes depositing phase change material within the opening, recessing the phase change material in the opening, forming a top electrode on the recessed phase change material, and forming a second metal region and a via in between the first and the second metal regions to connect the first metal region to the second metal region.

According to yet another embodiment of the present invention, a phase change memory element of a semiconductor structure is provided. The phase change memory element includes a bottom electrode formed at a contact surface of a conductive contact within a substrate having access circuitry, and an opening formed at an upper surface of the bottom electrode. The opening being formed of a height equal to a height of a metal region formed at a same layer within the semiconductor structure, and including a conformal film etched by a keyhole transfer operation or a collar operation and having recessed phase change material formed therein and top electrode material to form the top electrode within the opening.

According to yet another embodiment of the present invention, a semiconductor structure having a single mask adder phase change memory element embedded therein is provided. The semiconductor structure includes a plurality of conductive contacts recessed to form a plurality of vias at an upper surface of each conductive contact within a substrate including access circuitry to be connected with the conductive contacts and having a first dielectric layer formed thereon, a bottom electrode formed in each via, a first metal region formed within a second dielectric layer above the first dielectric layer at a respective bottom electrode, and an opening formed within the second dielectric layer to an upper surface of a respective bottom electrode and including a conformal film etched by a keyhole transfer operation or a collar operation and having recessed phase change material formed therein. The semiconductor structure further includes a top electrode formed on the recessed phase change material within the opening, a via formed in a third dielectric layer formed above the second dielectric layer, and a second metal region formed in a fourth dielectric layer above the third dielectric layer. The via in the third dielectric layer is formed in between the first and the second metal regions to connect the first metal region to the second metal region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present invention provides a single mask adder phase change memory element to be included in advanced CMOS technologies, bi-CMOS technologies and SiGe-based technologies. The fabrication of the semiconductor structure 200 (depicted in FIG. 18) including an embedded phase change memory element 150 will now be described below with reference to FIGS. 2 through 21.

Figure 1:
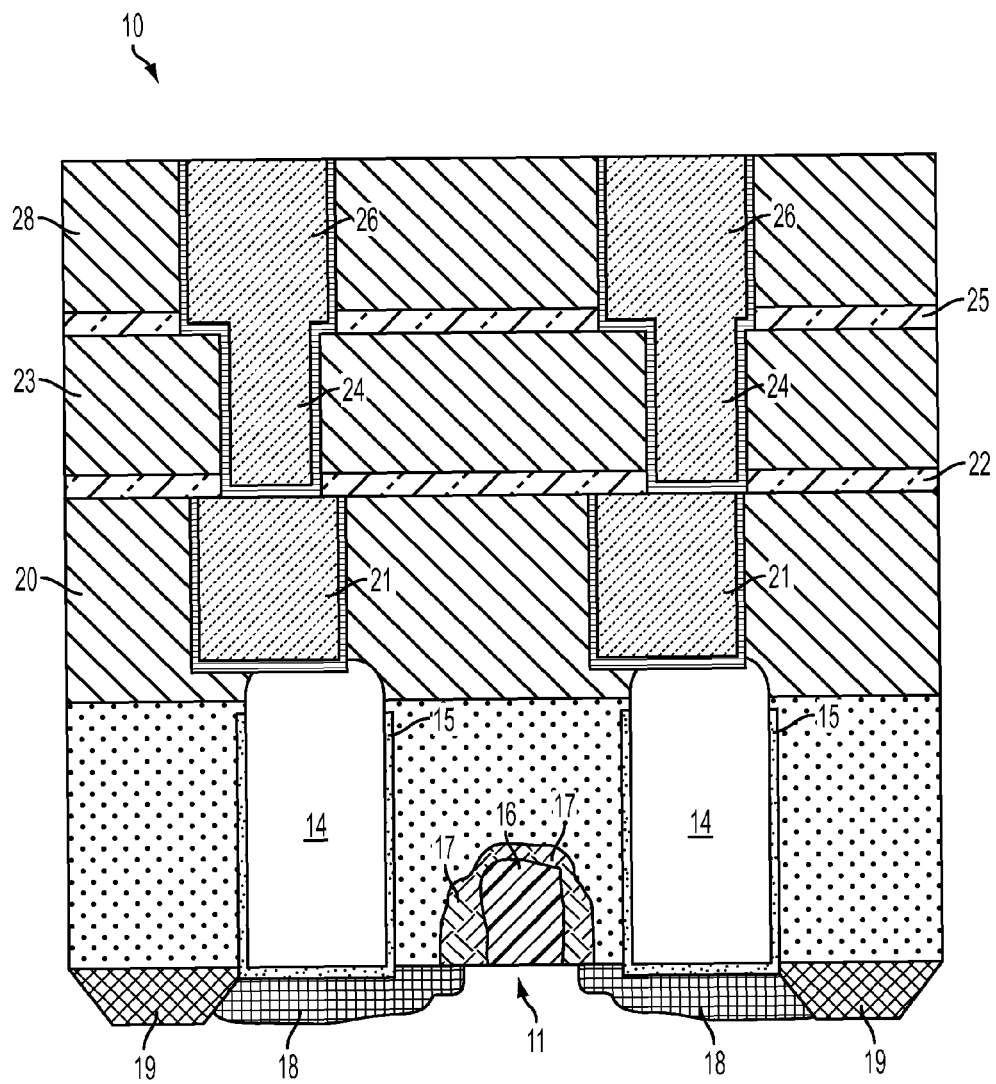
FIG. 1 is a diagram illustrating a conventional semiconductor structure.
Figure 2:
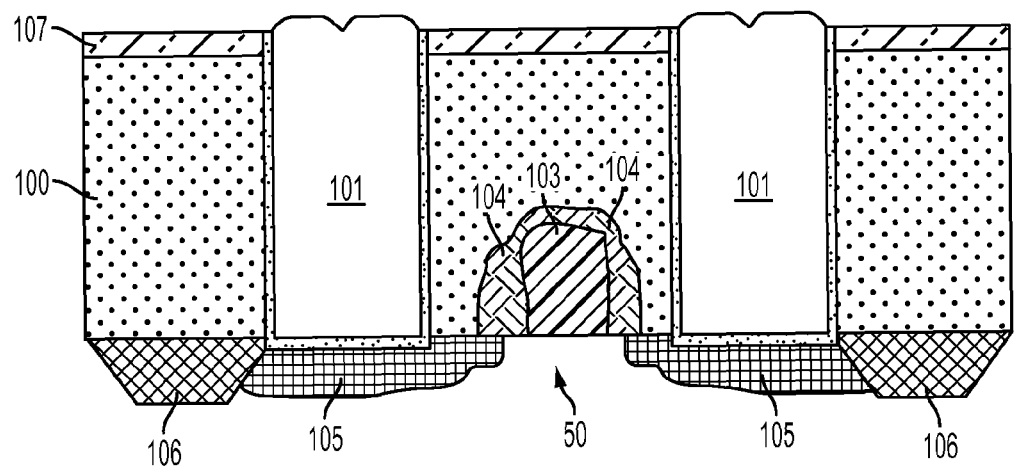
FIG. 2 is a diagram illustrating a fabrication operation of a semiconductor structure having an embedded phase change memory element that can be implemented within embodiments of the present invention.

With reference now to FIG. 2, a diagram illustrating a fabrication operation of a phase change memory element that can be implemented within embodiments of the present invention is provided. As shown in FIG. 2, a substrate 50 having a first dielectric layer 100 (e.g., a borophosphosilicate glass (BPSG) dielectric layer) formed thereon is provided. The present invention is not limited to a BPSG type wafer and any suitable type of wafer may be utilized for the purpose set forth herein. A plurality of conductive contacts 101 are formed in the BPSG dielectric layer 100 and surrounded by a liner 102 of titanium nitride, for example, used prior to the deposition of the contact fill, to form the conductive contacts 101. According to an embodiment of the present invention, the conductive contacts 101 may include tungsten (W), or titanium nitride (TiN), or copper (Cu), for example. The conductive contacts are connected to access circuitry (e.g., an access transistor) within the substrate 50. The access transistor includes a gate 103 and spacers 104 adjacent to the sidewalls of the gate 103, and source/drain regions 105. Shallow trench isolation (STI) regions 106 are formed within the substrate 50 to provide electrical isolation between the access transistor and other devices. The conductive contacts 101 connect to the source/drain regions 105. A first cap layer 107 is formed over the BPSG dielectric layer 100 of a predetermined thickness ranging from approximately 20 nanometers (nm) to approximately 50 nanometers (nm). The first cap layer 107 may include silicon nitride (SiN) or silicon dioxide (SiO$_2$), for example, however the present invention is not limited hereto. The first cap layer 107 is incorporated as a top layer of the BPSG dielectric layer 100 or alternatively the first cap layer 107 may be formed on top of the BPSG dielectric layer 100 and polished via a conventional polishing procedure. Fabrication processes of a bottom electrode will now be described below with reference to FIGS. 3 through 6 below. The bottom electrode may be formed in accordance with a patent application entitled "FLAT LOWER BOTTOM ELECTRODE OF PHASE CHANGE MEMORY" written by Breitwisch et al. and filed on Aug. 28, 2009 or in accordance with a patent application entitled "SELF-ALIGNED LOWER BOTTOM ELECTRODE" written by Matthew Breitwisch et al. and filed on Nov. 16, 2009, which are both incorporated herein by reference.

Figure 3:
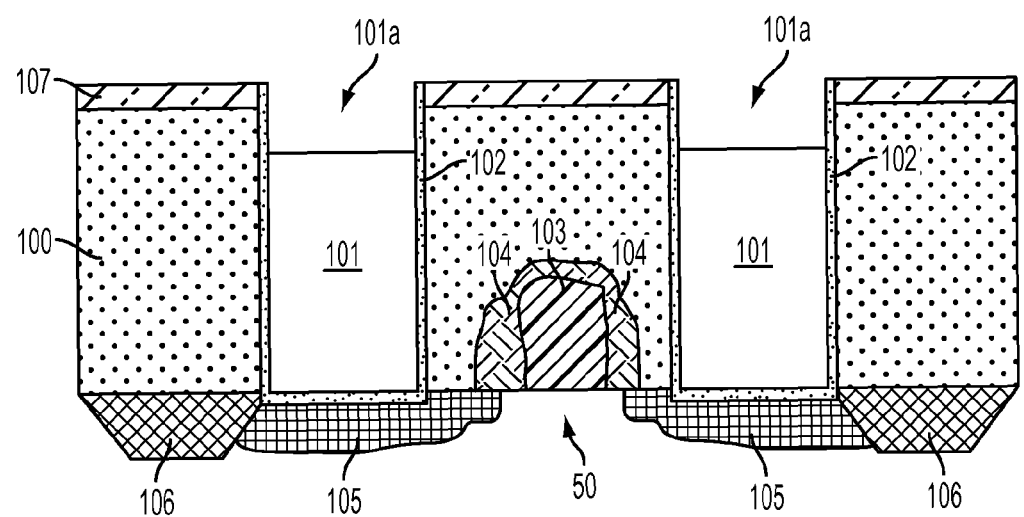
FIG. 3 is a diagram illustrating a recess operation of conductive contacts within the phase change memory element that can be implemented within embodiments of the present invention.

FIG. 3 is a diagram illustrating a recess operation of conductive contacts within the phase change memory element that can be implemented within embodiments of the present invention. As shown in FIG. 3, the conductive contacts 101 are recessed with respect to the first cap layer 107 using a reactive ion etching (RIE) process, for example, to form vias 101*a*. According to an embodiment of the present invention, the conductive contacts 101 are etched a depth of the first cap layer 107 plus an additional 10-15 (nm) nanometers to form the vias 101*a*.

Figure 4:
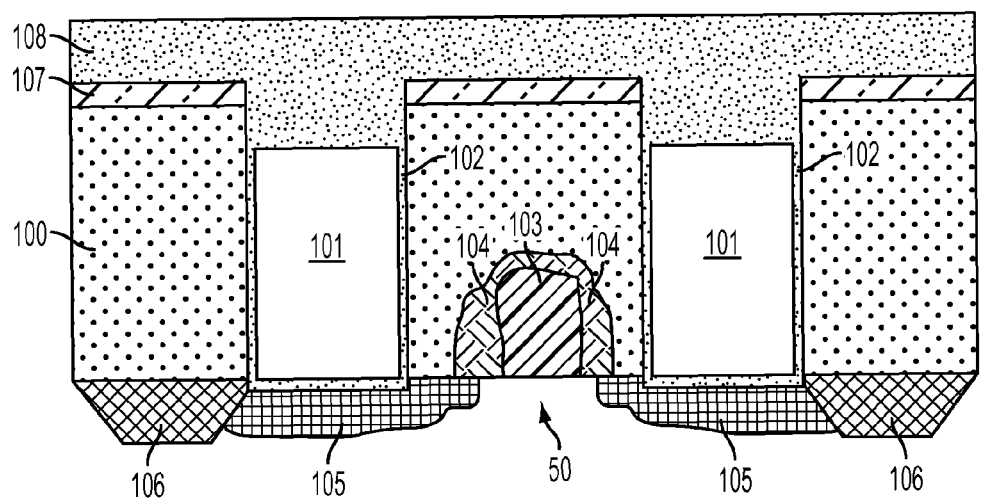
FIG. 4 is a diagram illustrating a deposition operation for forming a bottom electrode within the phase change memory element that can be implemented within embodiments of the present invention.

FIG. 4 is a diagram illustrating a deposition of electrode material within the phase change memory element that can be implemented within embodiments of the present invention. As shown in FIG. 4, a selectable electrode material 108 is deposited on the first cap layer 107 and within the vias 101*a*. According to an embodiment of the present invention, the selectable electrode material 108 may include titanium nitride (TiN), tungsten (W), or any suitable conductive material. According to one embodiment, approximately 10 nanometers (nm) of ion metal plasma (IMP) titanium may be deposited followed by a layer of titanium nitride, which is deposited via a chemical vapor deposition (CVD) process. According to an embodiment of the present invention, the electrode material 108 is compatible with the selected phase change material 120 as discussed later with reference to FIG. 12.

Figure 5:
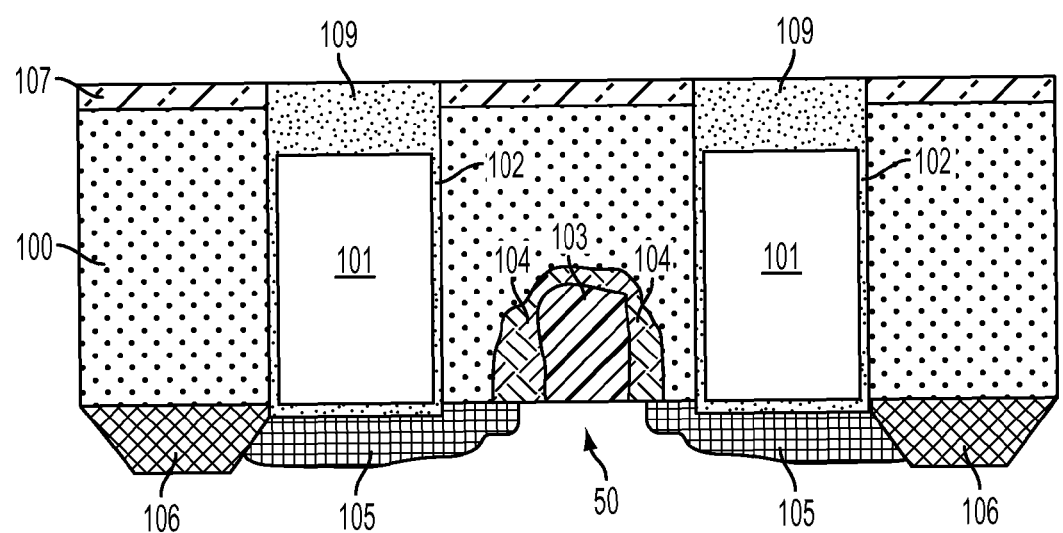
FIG. 5 is a diagram illustrating planarizing operation of the bottom electrode within the phase change memory element that can be implemented within embodiments of the present invention.

FIG. 5 is a diagram illustrating a planarization operation of the electrode material within the phase change memory element that can be implemented within embodiments of the present invention. As shown in FIG. 5, the electrode material 108 is planarized using a chemical mechanical polishing (CMP) process, to form a lower bottom electrode 109 over each conductive contact 101. In one embodiment of the present invention, the first cap layer 107 acts as a CMP stop layer.

Figure 6:
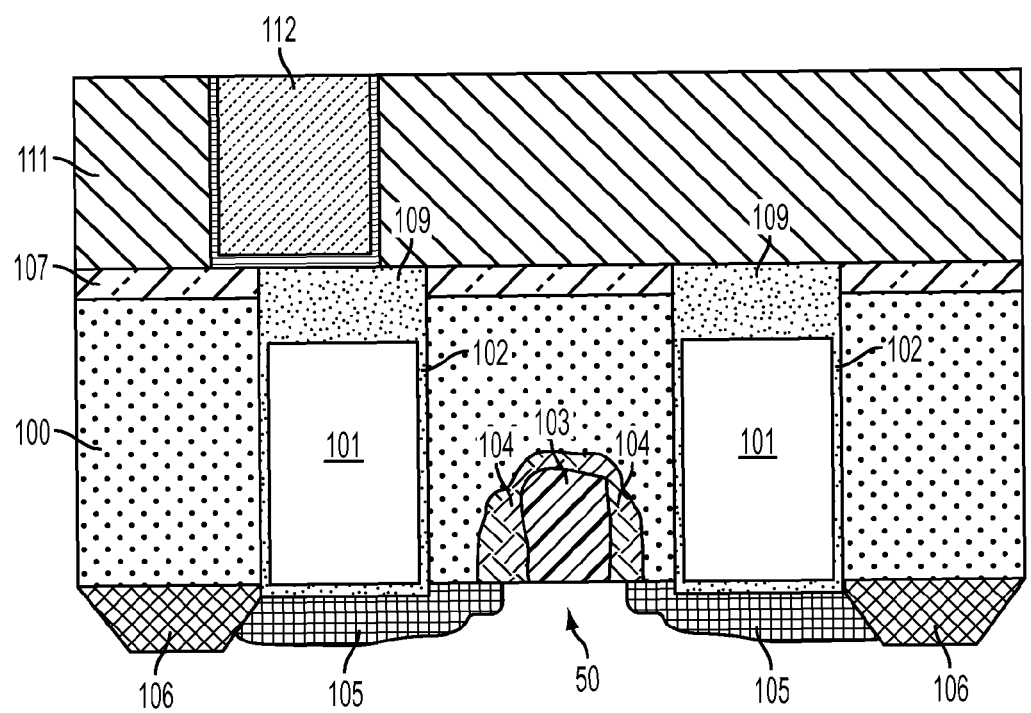
FIG. 6 is a diagram illustrating forming of a first metal region of the semiconductor structure that can be implemented within embodiments of the present invention.

FIG. 6 is a diagram illustrating formation of a first metal region within the semiconductor structure that can be implemented within embodiments of the present invention. As shown in FIG. 6, a second dielectric layer 111 is formed on the first cap layer 107 and a first metal region 112 (M1) is formed within the second dielectric layer 111. The second dielectric layer 111 may be formed of silicon dioxide ($SiO_2$), for example. The first metal region 112 may be formed of copper (Cu), for example however the present invention is not limited hereto, other types of metals including aluminum (Al), titanium nitride (TiN), and tungsten (W) based materials may be used.

Figure 7:
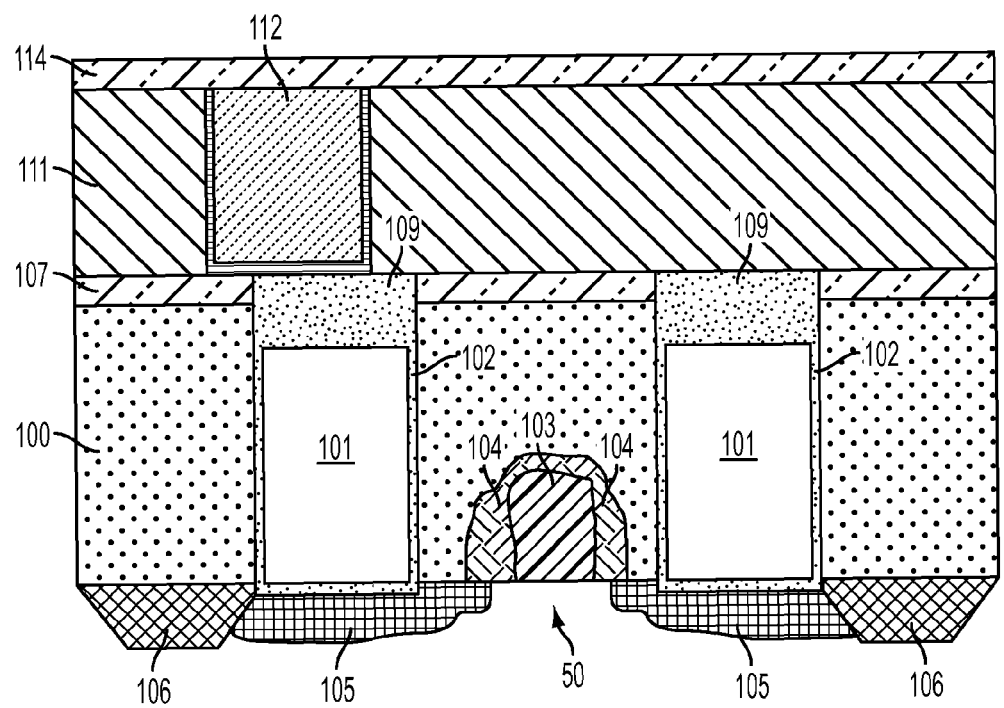
FIG. 7 is a diagram illustrating the deposition of a cap layer on the first metal region that can be implemented within embodiments of the present invention.

FIG. 7 is a diagram illustrating the formation of a second cap layer within the semiconductor structure that can be implemented within embodiments of the present invention. As shown in FIG. 7, a second cap layer 114 is formed on the second dielectric layer 111 and used to cap the metal contained in the first metal region 112. According to an embodiment of the present invention, the second cap layer 114 may be formed of the same material as the first cap layer 107. For example, both the first and second cap layers 107 and 114 may be formed of silicon nitride (SiN), for example. The fabrication of the embedded phase change memory cell will now be discussed below with reference to FIGS. 8 through 21.

Figure 8:
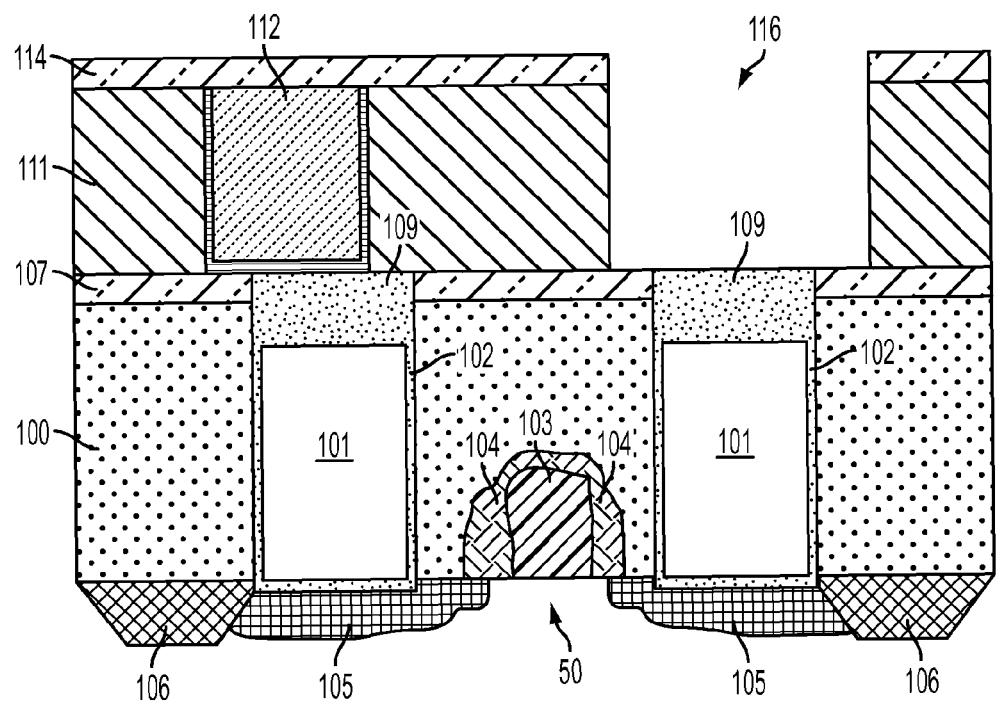
FIG. 8 is a diagram illustrating the formation of an opening to define a bit line within the phase change memory element that can be implemented within embodiments of the present invention.

FIG. 8 is a diagram illustrating the formation of an opening for the phase change memory element that can be implemented within embodiments of the present invention. As shown in FIG. 8, an opening 116 is etched through the second cap layer 114 and the second dielectric layer 111 to contact an upper surface of the respective bottom electrode 109. According to an embodiment of the present invention, the opening 116 may be a trench or a via. As shown in FIG. 8, the opening 116 is adjacent to the first metal region 112 and is formed at a height of a same height as that of the first metal region 112. The opening 116 is formed within the same layer (e.g., second dielectric layer 111) of the semiconductor structure. The opening 116 is etched to define a bitline of the phase change memory. A keyhole transfer method will now be discussed below with reference to FIGS. 9 through 11. An alternative collar process method will be discussed further below with reference to FIGS. 14 through 16.

Figure 9:
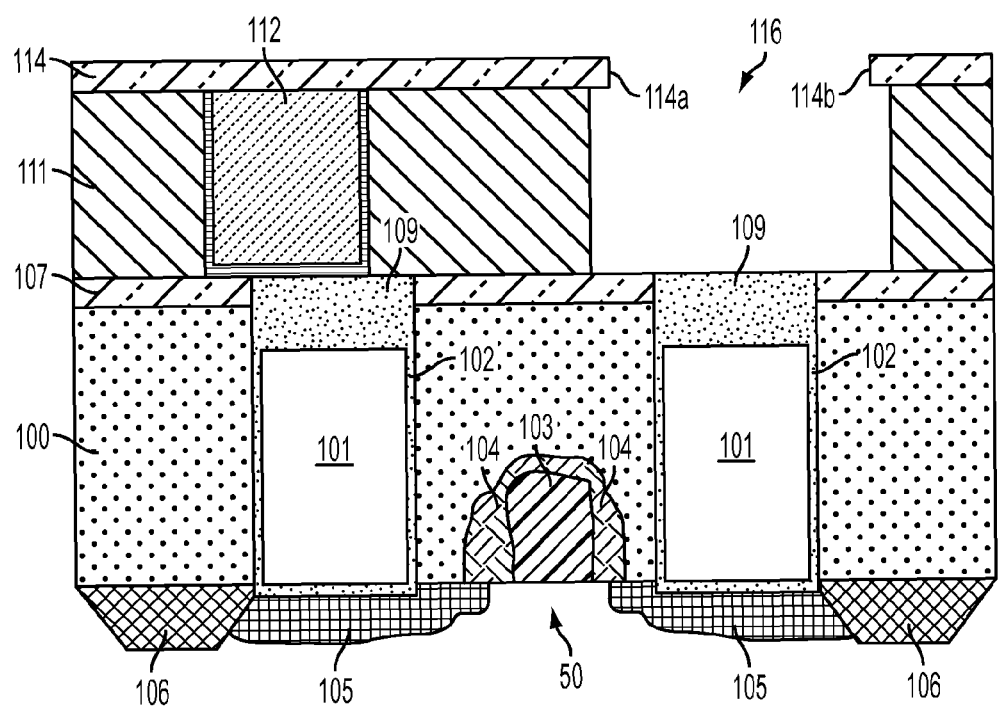
FIG. 9 is a diagram illustrating a recessing operation of the opening of FIG. 8 that can be implemented within embodiments of the present invention.

FIG. 9 is a diagram illustrating a recessing operation of the opening 111 of FIG. 8 that can be implemented within embodiments of the present invention. As shown in FIG. 9, the second dielectric layer 111 is recessed, creating overhang portions 114*a* and 114*b* of the second cap layer 114. The second dielectric layer 111 is recessed using a buffered oxide etching (BOE) process, for example.

Figure 10:
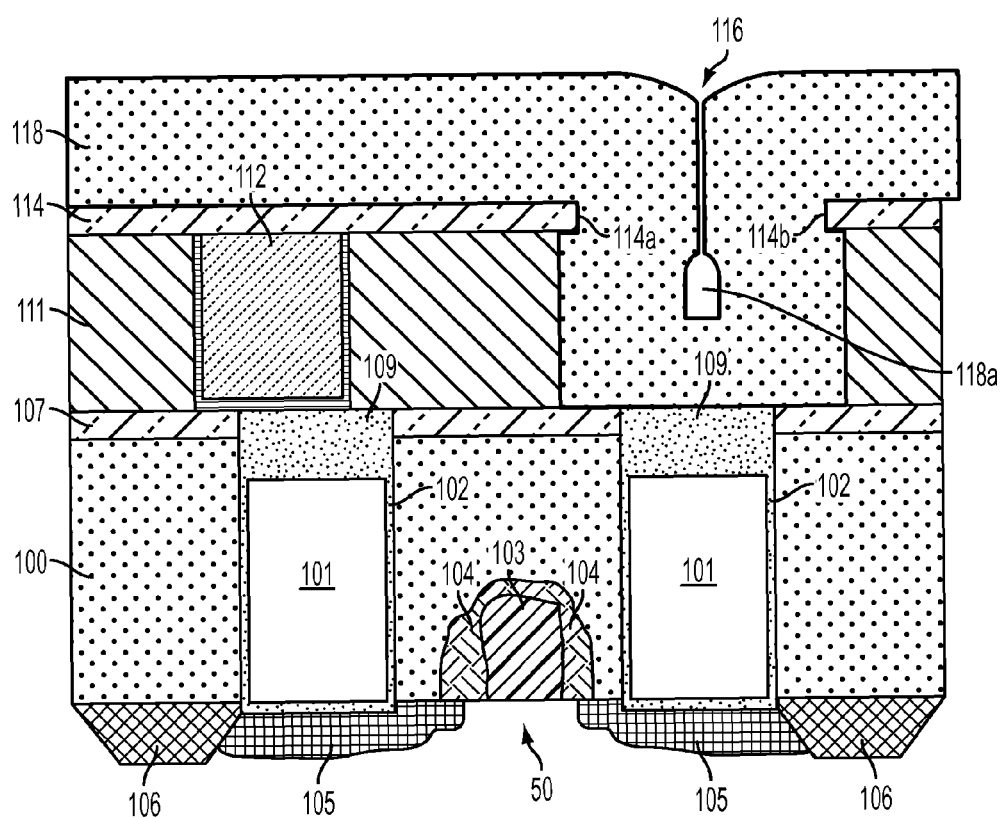
FIG. 10 is a diagram illustrating a deposition operation of a conformal film that can be implemented within embodiments of the present invention.

FIG. 10 is a diagram illustrating a deposition operation of a conformal film within the opening 116 that can be implemented within embodiments of the present invention. As shown in FIG. 10, a conformal film 118 is deposited within the via 116 and pinched to form a void (i.e., a keyhole structure 118*a*) in a lower region of the via 116. The conformal film 118 is may be CVD or ALD silicon oxide (SiO) or silicon nitride (SiN). Alternatively, a collar deposition operation may be performed to form a scaled aperture down to the upper surface of the bottom electrode 109 described later below with reference to FIGS. 14 through 16.

Figure 11:
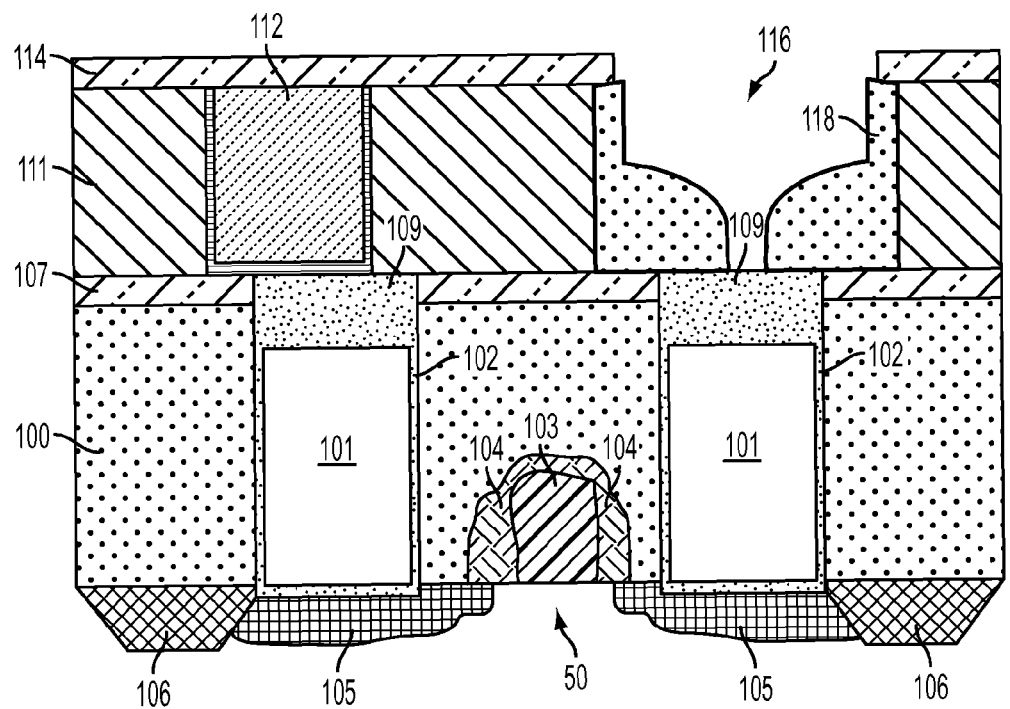
FIG. 11 is a diagram illustrating an etching operation of the conformal film shown in FIG. 10 that can be implemented within embodiments of the present invention.

FIG. 11 is a diagram illustrating an etching operation of the conformal film of FIG. 10 that can be implemented within embodiments of the present invention. As shown in FIG. 11, the conformal film 118 is recessed by an anistropic etching process and the keyhole structure 118*a* is transferred down to an upper surface of the lower bottom electrode 109.

Figure 12:
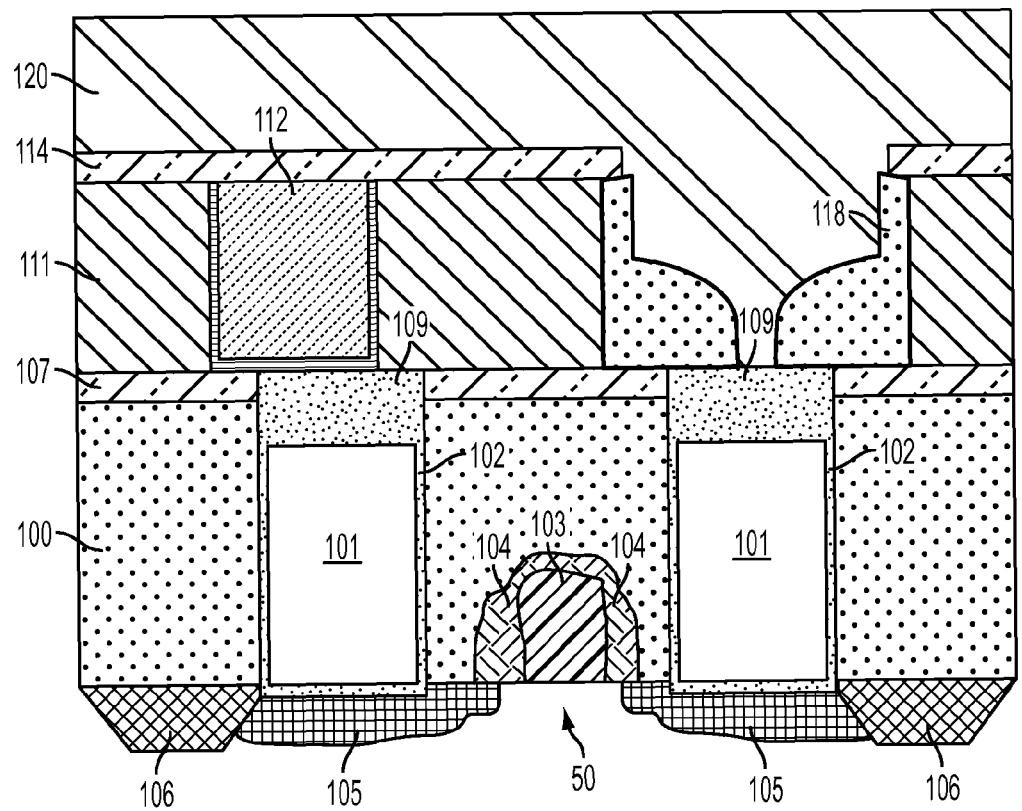
FIG. 12 is a diagram illustrating a deposition operation of phase change material within the opening of the phase change memory element that can be implemented within embodiments of the present invention.

FIG. 12 is a diagram illustrating a deposition of phase change material within the phase change memory element that can be implemented within embodiments of the present invention. As shown in FIG. 12, phase change material 120 is deposited within the opening 116, thereby filling the opening 116 and along the second cap layer 114. According to an embodiment of the present invention, the phase change material 120 may be made of germanium-antimony-telluride (GeSbTe) or one of alloys of gallium (Ga)/Sb, indium (In)/Sb, In/selenium (Se), Sb/Te, Ge/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S). A wide range of alloy compositions may be used. The phase change material 120 may be deposited using a physical vapor deposition (PVD) process, a chemical vapor deposition (CVD) process, a spin-on process, or an electrochemical plating process, for example, or any other suitable deposition operation.

Figure 13:
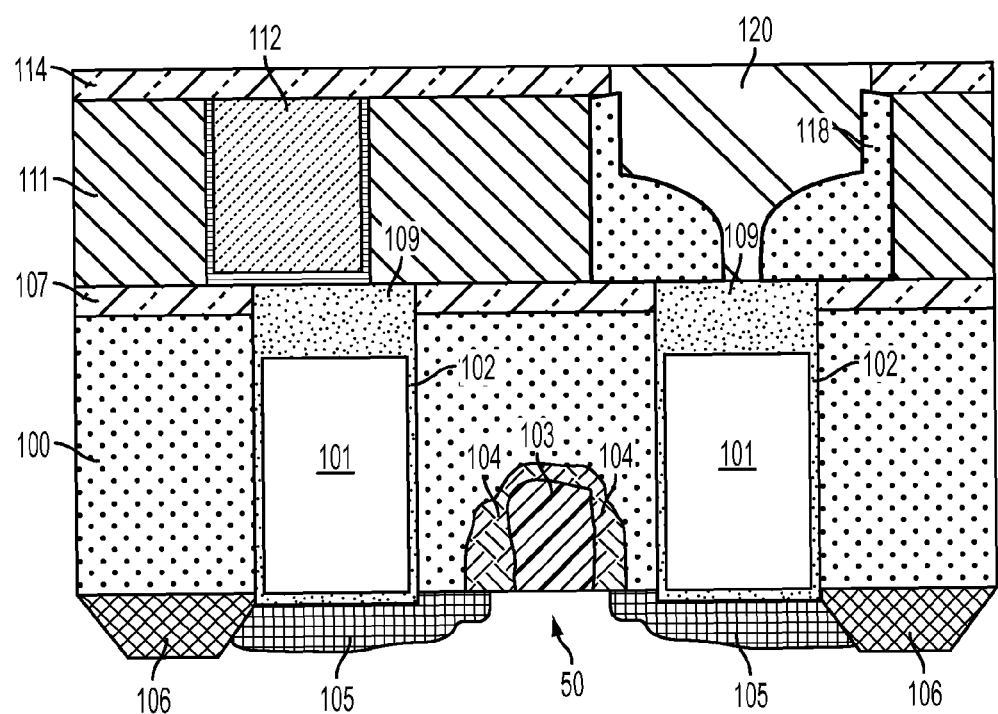
FIG. 13 is a diagram illustrating a planarization operation of the phase change material of the phase change memory element that can be implemented within embodiments of the present invention.
Figure 16:
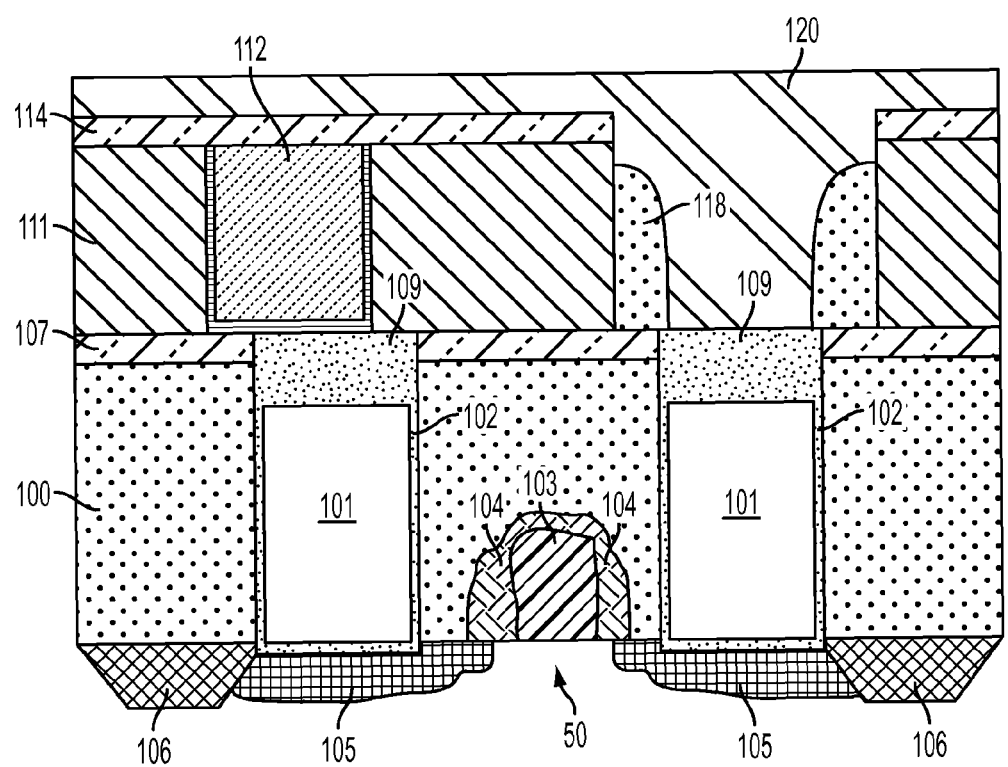
FIG. 16 is a diagram illustrating a deposition operation of phase change material that can be implemented within alternative embodiments of the present invention.

FIG. 13 is a diagram illustrating a planarizing operation of the phase change material of the phase change memory element shown in FIG. 12 that can be implemented within embodiments of the present invention. As shown in FIG. 16, the phase change material 120 is polished using a chemical mechanical polishing (CMP) process. As further shown, the phase change material 120 is stopped at the second cap layer 114. Thus, the second cap layer 114 acts as a CMP stop layer.

Figure 14:
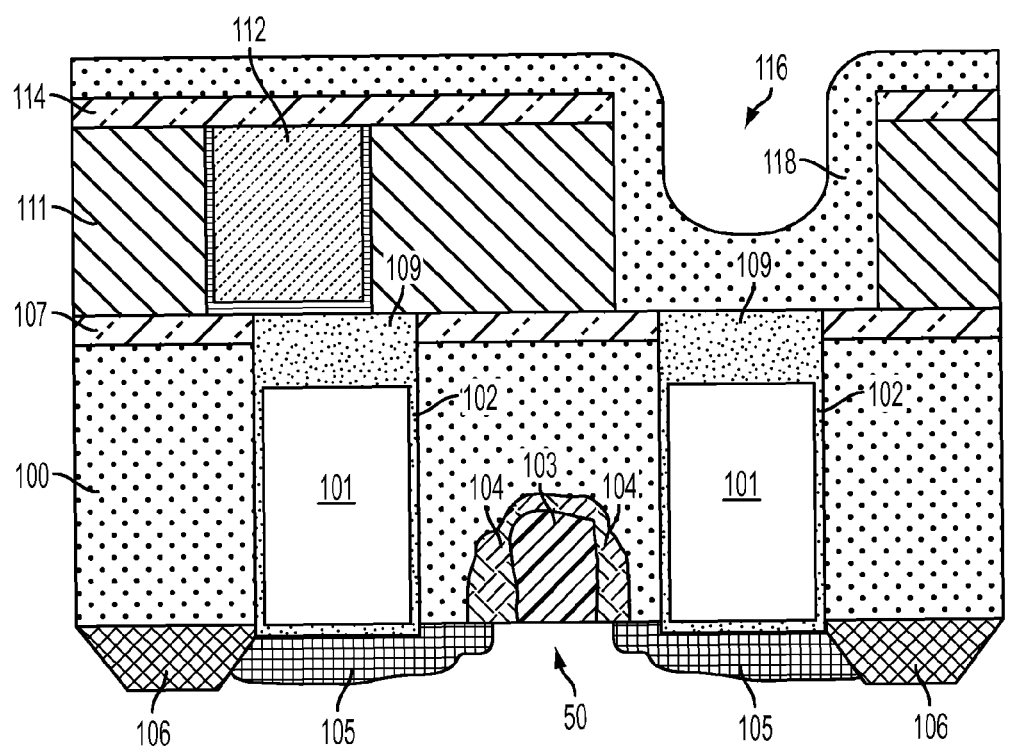
FIG. 14 is a diagram illustrating a deposition operation of a conformal film that can be implemented within alternative embodiments of the present invention.
Figure 15:
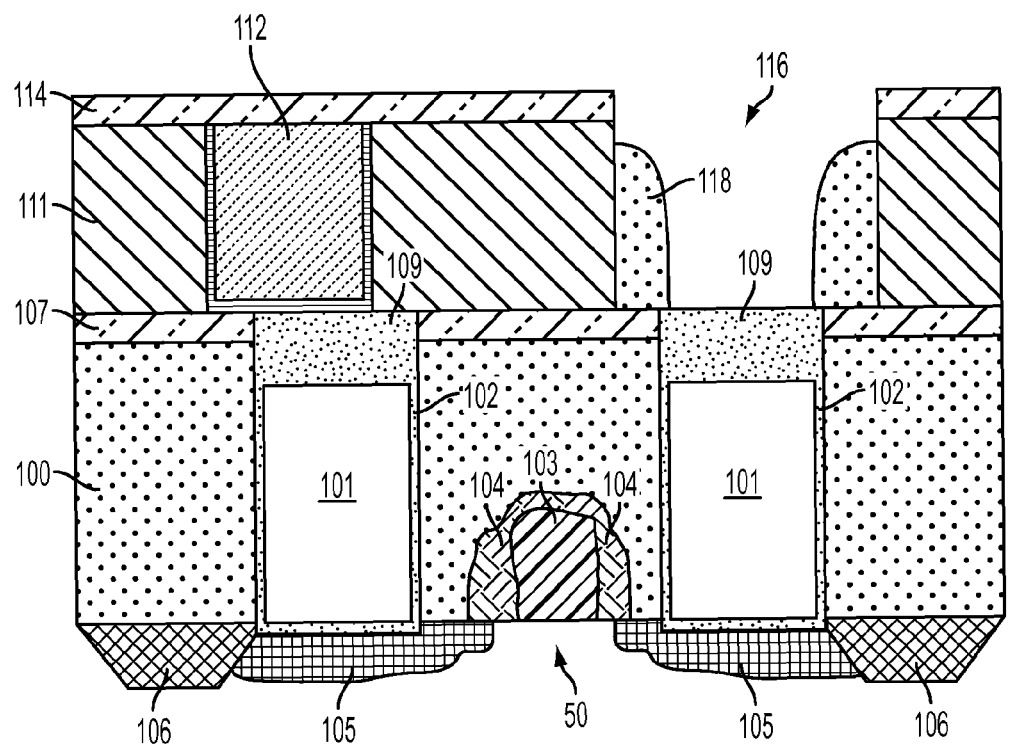
FIG. 15 is a diagram illustrating an etching operation of the conformal film shown in FIG. 14 that can be implemented within alternative embodiments of the present invention.

FIGS. 14 through 16 illustrate deposition and etching operations of the conformal film that can be implemented within alternative embodiments of the present invention. Specifically, FIGS. 14 through 16 illustrate a collar process for depositing and etching of the conformal film 118. As shown in FIG. 14, the conformal film 118 is deposited within the opening 111. In FIG. 15, the conformal film 118 is etched down to an upper surface of the bottom electrode 109 via a reactive ion etching (RIE) operation. According to an embodiment of the present invention, the width of the remaining conformal film 118 after etching may vary as necessary such that the width of the opening 116 is reduced after the collar process is completed. In FIG. 15, the phase change material 120 is deposited into the opening 116. Next, planarization of the phase change material 120 is performed in a same manner as discussed above with reference to FIG. 13.

Figure 17:
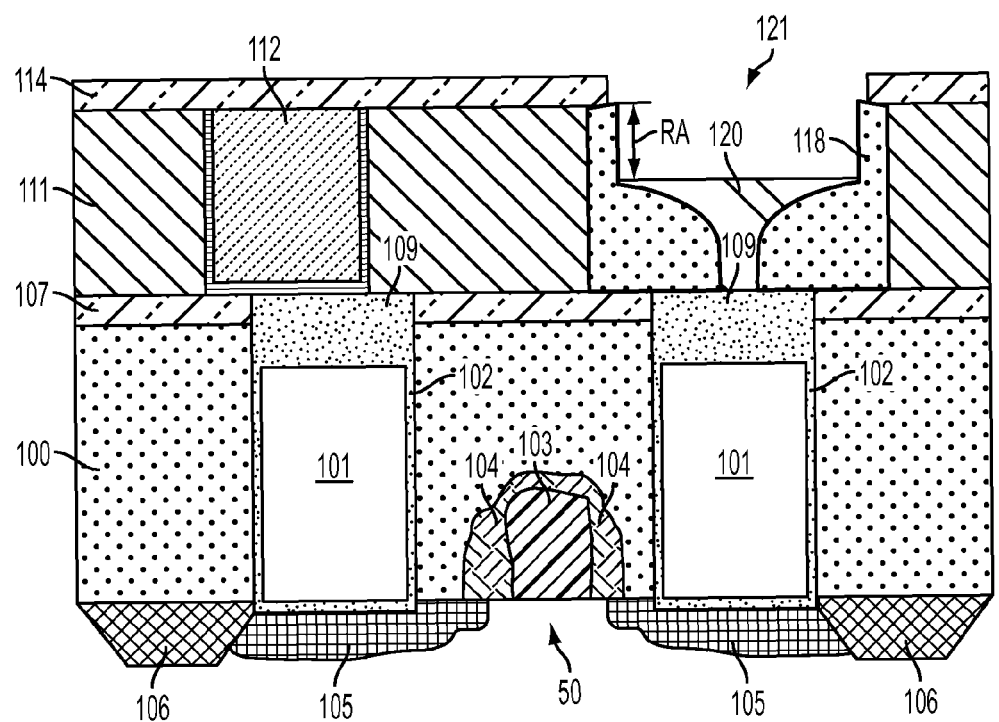
FIG. 17 is a diagram illustrating a recess operation of the phase change material that can be implemented within embodiments of the present invention.

FIG. 17 is a diagram illustrating a recess operation of the phase change material within the phase change memory element that can be implemented within embodiments of the present invention. As shown in FIG. 17, the phase change material 120 is recessed a predetermined recessed amount (RA) using a RIE process, a sputtering process, or a wet chemistry process, for example to form a via 121. According to an embodiment of the present invention, the predetermined recessed amount RA ranges from approximately 15 nanometers (nm) to approximately 60 nanometers (nm). According to an embodiment of the present invention, the via 121 may be of a height equal to one-half a height of the first metal region 112. According to another embodiment of the present invention, the via 121 is of a predetermined height ranging from approximately 20 nanometers (nm) to 100 nanometers (nm).

Figure 18:
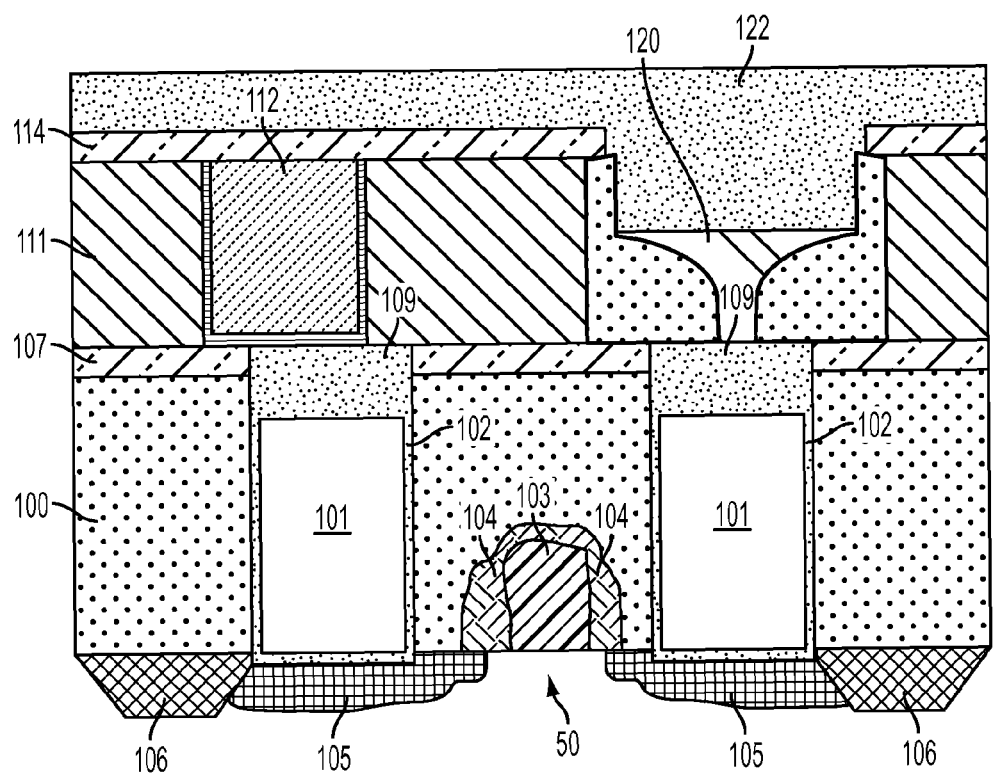
FIG. 18 is a diagram illustrating a formation operation of a top electrode of the phase change memory element that can be implemented within embodiments of the present invention.

FIG. 18 is a diagram illustrating the formation of a top electrode of the phase change memory element that can be implemented within embodiments of the present invention. As shown in FIG. 18, a top electrode 123 (as depicted in FIG. 19) is formed by first depositing electrode material 122 (e.g., a phase change material capping layer) such as titanium nitride (TiN) for example, on the second cap layer 114 and within the via 121.

Figure 19:
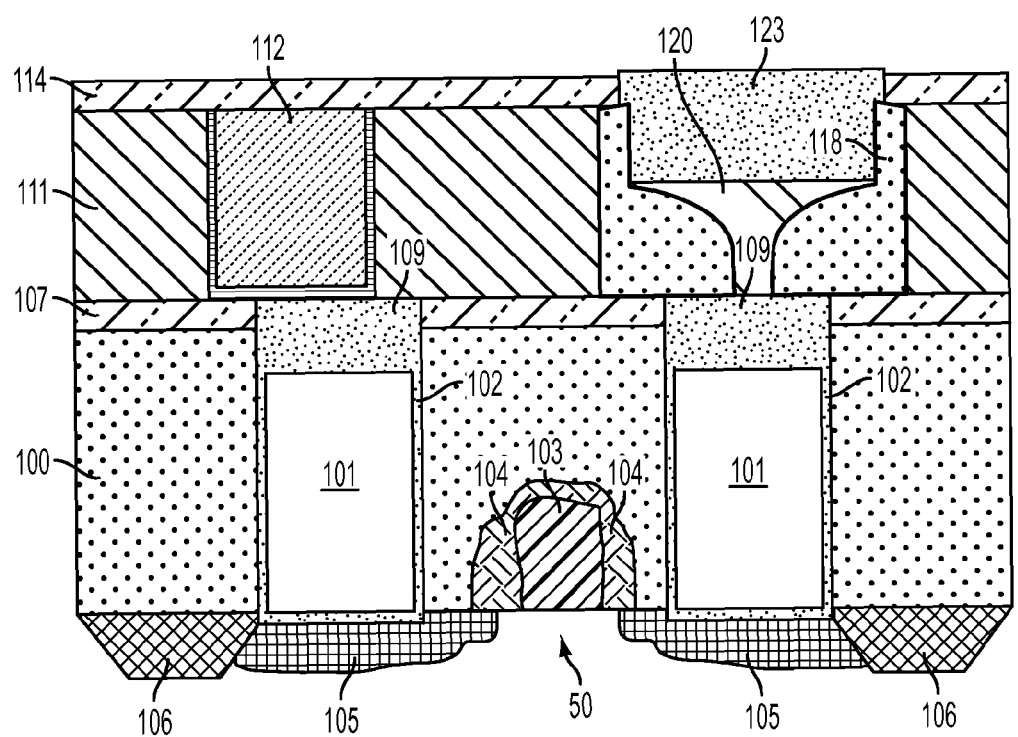
FIG. 19 is a diagram illustrating a planarizing operation of the top electrode of the phase change memory element that can be implemented within embodiments of the present invention.
Figure 21:
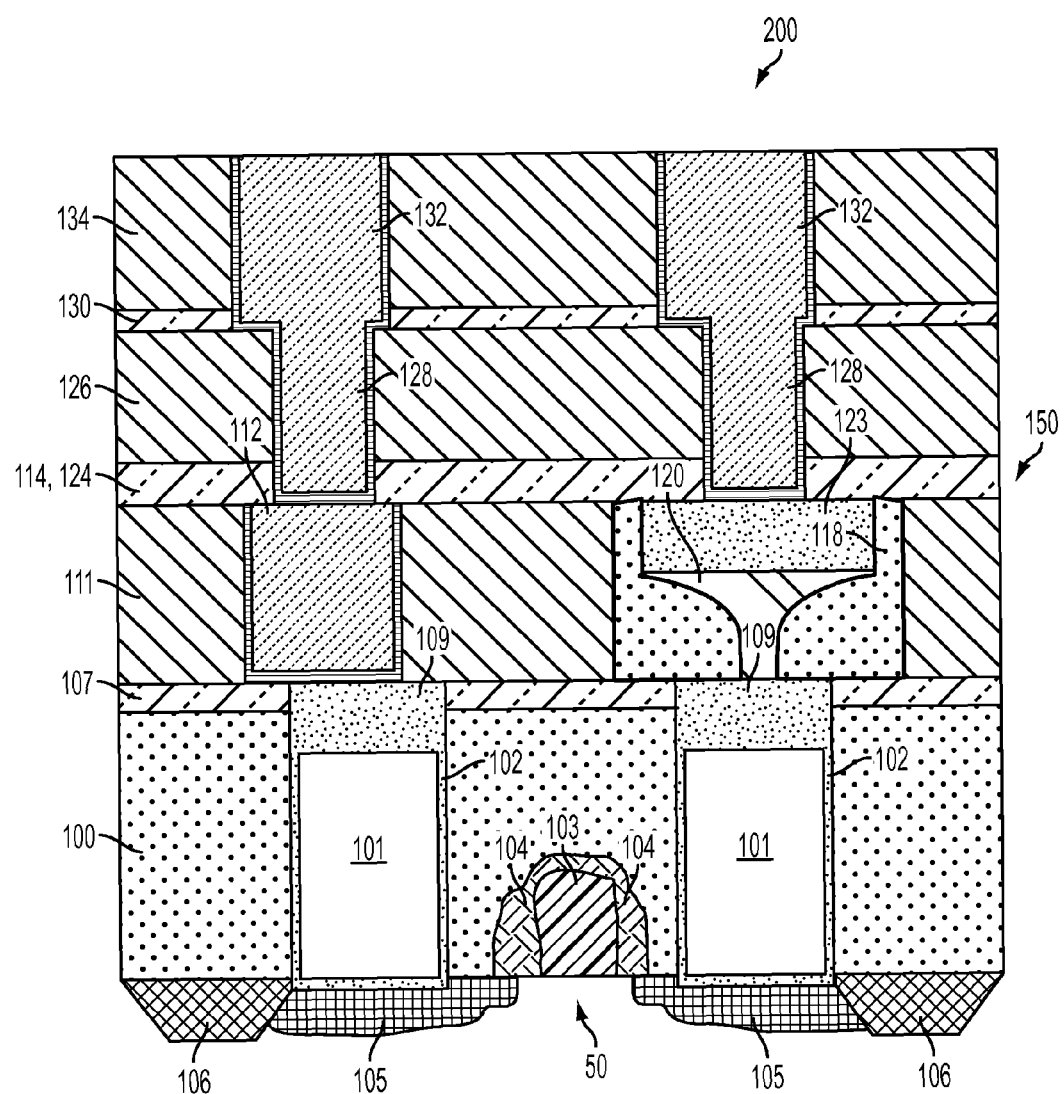
FIG. 21 is a diagram illustrating a final fabrication operation of the semiconductor structure that can be implemented within embodiments of the present invention.

FIG. 19 is a diagram illustrating a planarization operation of the top electrode 123 of the phase change memory. As shown in FIG. 19, the material 122 is removed from the upper surface of the second cap layer 114 such that the material 122 (e.g., the CMP titanium nitride (TiN)) stops at the second cap layer 114 to form the top electrode 123. According to an embodiment of the present invention, the bottom electrode 109 and the top electrode 123 are made of the same material. As shown in FIG. 21, a resulting phase change memory element 150 is formed. According to one embodiment of the present invention, the phase change material 120 and the top electrode 123 together may be formed such that they are a same height as the first metal region 112 within the semiconductor structure.

Figure 20:
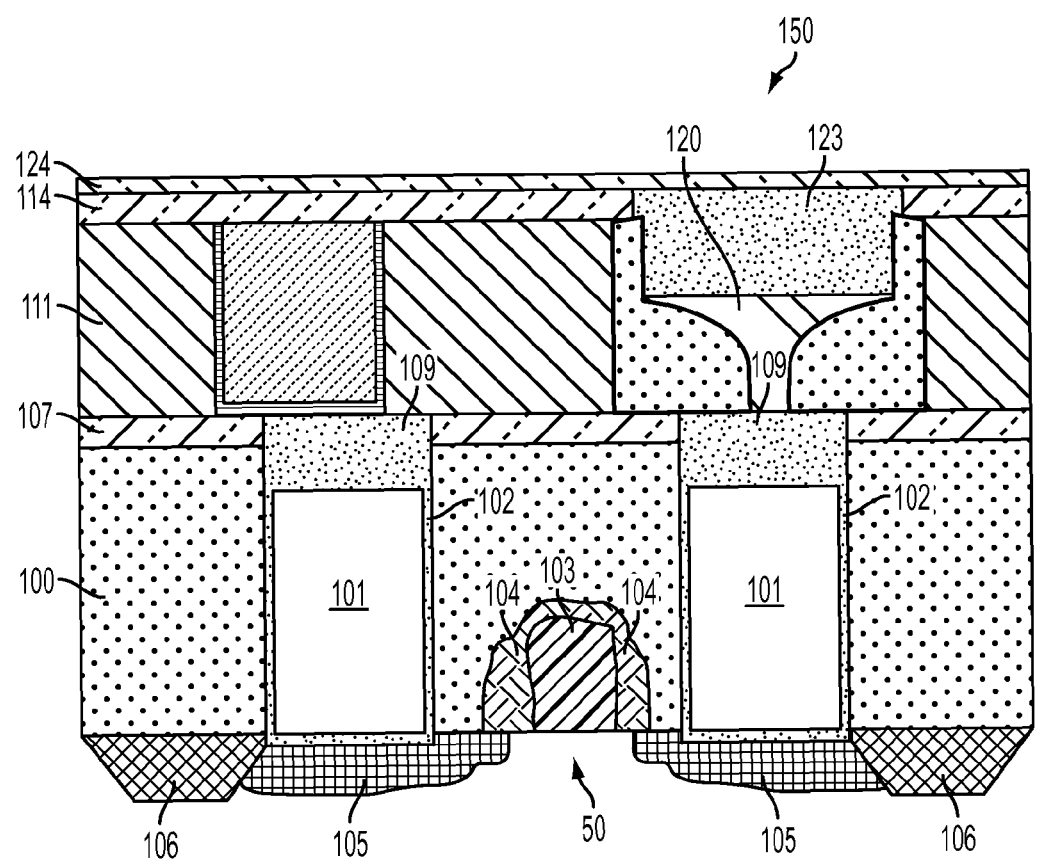
FIG. 20 is a diagram illustrating a deposition a cap layer above the phase change memory element that can be implemented within embodiments of the present invention.

Further, in FIG. 20, a third cap layer 124 is formed on an upper surface of the second cap layer 114 and the top electrode 123 to cap the top electrode 123. The third cap layer 124 may be formed of the same material as that of the first and second cap layers 107 and 114. For example, all three cap layers 107, 114 and 124 may be formed of silicon nitride (SiN), for example. Next, in FIG. 21, the remaining back-of-the-line process (e.g., the final fabrication process) is performed to form a semiconductor structure 200.

It should be noted that although the processing order described here is the first metallization process first followed by the formation of the phase change element, it is also herein disclosed that the reverse order of these two processes may occur.

FIG. 21 is a diagram illustrating the final fabrication process of a semiconductor structure that can be implemented within embodiments of the present invention. As shown in FIG. 21, the semiconductor structure 200 further includes a third dielectric layer 126 on the third cap layer 124 and having a via 128 formed therein, a fourth cap layer 130 is formed on an upper surface of the third dielectric layer 126 to cap the material contained in the via 128, and a second metal region 132 is formed in a fourth dielectric layer 134 on an upper surface of the via 128. The via 128 connects the first metal region 112 to the second metal region 132. According to an embodiment of the present invention, the via 128 and the second metal region 134 may be formed using a conventional single or dual damascene process such that the via 128 and the second metal region 134 are formed separately or simultaneously.

Embodiments of the present invention provide a method of fabricating an embedded phase change memory element into a semiconductor structure using only a single lithographic masking operation. Therefore, the present invention provides the advantages of minimizing the number of additional masking levels and in turn minimizing associated processing costs. The present invention also provide additional advantages such as maintaining low reset current and having a small footprint by using a keyhole transfer operation to form a sub-lithography aperture and the metallization layers occurring in the same physical location as the structure without the phase change element so that the electrical models associated with the wiring capacitance and resistance are identical or very similar with or without the additional phase change element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:
1. A method of fabricating a phase change memory element within a semiconductor structure, the method comprising:
   etching an opening to an upper surface of a bottom electrode, the first opening being formed of a height equal to a height of a metal region formed within a dielectric layer at a same layer within the semiconductor structure;

depositing a conformal film within the opening and recessing the conformal film to expose the upper surface of the bottom electrode;

depositing phase change material within the opening;

recessing the phase change material within the opening; and forming a top electrode on the recessed phase change material.

2. The method of claim 1, wherein depositing a conformal film within the opening and recessing the conformal film comprises:

recessing sidewalls of the opening prior to depositing the conformal film;

forming a key hole within the conformal film at a center region of the opening; and transferring the key hole to the upper surface of the bottom electrode.

3. The method of claim 1, wherein recessing the phase change material comprises:

forming a via at an upper surface of the recessed phase change material for depositing top electrode material to form the top electrode.

4. The method of claim 3, wherein the via formed at the upper surface of the recessed phase change material is of a predetermined height equal to one-half the height of the metal region.

5. The method of claim 3, wherein the via formed at the upper surface of the recessed phase change material is of a height ranging from approximately 5 nanometers (nm) to 100 nanometers (nm).

6. The method of claim 1, wherein the opening is formed of a trench or a via.

7. A method for fabricating a semiconductor structure having a single mask adder phase change memory element embedded therein, the method comprising:

recessing a plurality of conductive contacts to form a plurality of vias at an upper surface of each conductive contact within a substrate including access circuitry to be connected with the conductive contacts and first dielectric layer formed thereon;

forming a bottom electrode in each via formed;

forming a first metal region within a second dielectric layer formed on a respective bottom electrode;

etching an opening within the second dielectric layer to an upper surface of a respective bottom electrode adjacent to the first metal region;

depositing a conformal film within the opening and recessing the conformal film to expose the upper surface of the respective bottom electrode;

depositing phase change material within the opening;

recessing the phase change material in the opening;

forming a top electrode on the recessed phase change material; and forming a second metal region and a via in between the first and the second metal regions to connect the first metal region to the second metal region.

8. The method of claim 7, wherein depositing a conformal film within the opening and recessing the conformal film comprises:

recessing sidewalls of the opening prior to depositing the conformal film;

forming a key hole within the conformal film at a center region of the opening; and transferring the key hole to the upper surface of the bottom electrode.

9. The method of claim 7, wherein the first metal region is formed after the phase change memory element.

10. The method of claim 7, wherein the plurality of conductive contacts are recessed a depth equal to approximately 10 nanometers (nm) to 15 nanometers (nm) in addition to a depth of the first dielectric layer to form the plurality of vias.

11. The method of claim 7, wherein forming the bottom electrode comprises:

depositing electrode material on the a cap layer capping the first dielectric layer and within each via; and planarizing the electrode material outside of each via.

12. The method of claim 11, wherein the electrode material comprises at least one of titanium nitride (TiN) or tungsten (W).

13. The method of claim 7, wherein the opening formed is of height equal to a height of the first metal region.

14. The method of claim 7, wherein recessing the phase change material comprises:

forming a via at an upper surface of the phase change material for depositing top electrode material to form the top electrode.

15. The method of claim 7, wherein the via formed at the upper surface of the recessed phase change material is of a predetermined height equal to one-half the height of the metal region.

16. The method of claim 7, wherein the via formed at the upper surface of the recessed phase change material is of a height ranging from approximately 5 nanometers (nm) to approximately 100 nanometers (nm).

17. The method of claim 7, wherein the opening is formed of a trench or a via.

* * * * *